(12) United States Patent
Lee et al.

(10) Patent No.: US 11,495,655 B2
(45) Date of Patent: Nov. 8, 2022

(54) DISPLAY DEVICE

(71) Applicant: SAMSUNG DISPLAY CO., LTD., Yongin-si (KR)

(72) Inventors: Jeong Doo Lee, Yongin-si (KR); Min Woo Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 42 days.

(21) Appl. No.: 17/116,126

(22) Filed: Dec. 9, 2020

(65) Prior Publication Data
US 2021/0249500 A1 Aug. 12, 2021

(30) Foreign Application Priority Data

Feb. 12, 2020 (KR) .................. 10-2020-0017182

(51) Int. Cl.
*H01L 27/32* (2006.01)
*G09G 3/00* (2006.01)

(52) U.S. Cl.
CPC ......... *H01L 27/3276* (2013.01); *G09G 3/006* (2013.01); *H01L 27/326* (2013.01); *H01L 27/3223* (2013.01)

(58) Field of Classification Search
CPC ............... H01L 27/326; H01L 27/3223; H01L 27/3276
See application file for complete search history.

(56) References Cited

U.S. PATENT DOCUMENTS

| 9,768,068 | B2 | 9/2017 | Choi et al. | |
| 10,446,069 | B2 | 10/2019 | Kim et al. | |
| 2005/0180083 | A1* | 8/2005 | Takahara | H01L 27/3223 361/152 |
| 2008/0007683 | A1* | 1/2008 | Maki | G09G 3/3648 349/139 |
| 2019/0173278 | A1 | 6/2019 | Jang et al. | |
| 2021/0151712 | A1* | 5/2021 | Lee | H01L 27/326 |

FOREIGN PATENT DOCUMENTS

| KR | 10-2016-0082555 | 7/2016 |
| KR | 10-2017-0015698 | 2/2017 |
| KR | 10-2019-0066498 | 6/2019 |
| KR | 10-2019-0096473 | 8/2019 |

* cited by examiner

*Primary Examiner* — Douglas M Menz
(74) *Attorney, Agent, or Firm* — F. Chau & Associates, LLC

(57) ABSTRACT

A display device includes a substrate having a display area and a non-display area. A plurality of pixels is disposed in the display area. A chip mount area is disposed on the non-display area. The chip mount area includes a data output pad unit, a lighting test transistor unit and a plurality of lines connecting the data output pad unit and the lighting test transistor unit. The lighting test transistor unit is configured to transfer at least one lighting test signal to the plurality of pixels through the data output pad unit. The resistances of each of the plurality of lines are the same.

20 Claims, 10 Drawing Sheets

OPD : DMP11, DMP21, DTP11
IPD : DMP12, DMP22, DTP12

DM_OP : DM_OP1, DM_OP2, DM_OP3
DM_IP : DM_IP1, DM_IP2, DM_IP3

DM_OP': DM_OP1', DM_OP2', DM_OP3'
DM_IP: DM_IP1, DM_IP2, DM_IP3

DISPLAY DEVICE

CROSS-REFERENCE TO RELATED APPLICATION

This application claims priority under 35 U.S.C. § 119 to Korean Patent Application No. 10-2020-0017182, filed on Feb. 12, 2020 in the Korean Intellectual Property Office, the disclosure of which is incorporated by reference in its entirety herein.

TECHNICAL FIELD

The present inventive concepts relate to a display device.

DISCUSSION OF RELATED ART

A display device is a device that displays an image. The display device includes a display panel, such as an organic light emitting display panel or a liquid crystal display panel.

An organic light emitting diode display device ("OLED display device") is a type of self-emissive display device. The OLED display device comprises an organic light emitting layer interposed between a pixel electrode and an opposite electrode. When the pixel electrode and the opposite electrode respectively inject an electron and a hole into the organic light emitting layer, an exciton is generated by the combination of the electron and the hole. Light is generated as the exciton falls from an excitation state to a ground state.

A display device using a chip on plastic (COP) or chip on glass (COG) method for directly attaching a driving integrated circuit to a transistor array substrate comprises a chip mount area to which the driving integrated circuit is bonded. The chip mount area may comprise a plurality of output pads that are electrically connected to an output bump of the driving integrated circuit, and a plurality of input pads that are electrically connected to an input bump of the driving integrated circuit to supply a signal from the outside to the driving integrated circuit.

A lighting test may be performed in a process of manufacturing the display panel of the display device. The lighting test tests whether the display panel is driven by applying a test signal to a display panel in a state in which the driving integrated circuit is not mounted on the chip mount area.

In such a display device, static electricity may be generated in a manufacturing process of the display device. When the static electricity is generated and the static electricity is transferred to a lighting test thin film transistor, the thin film transistor may be damaged and a normal lighting test may not be performed.

SUMMARY

A technical object of the present inventive concepts is to provide a display device that protects a lighting test thin film transistor from static electricity generated during a manufacturing process.

The objects of the disclosure are not limited to the above-described technical object, and other technical objects that are not described will be clearly understood by those skilled in the art from the following description.

According to an exemplary embodiment of the present inventive concepts, a display device includes a substrate having a display area and a non-display area. A plurality of pixels is disposed in the display area. A chip mount area is disposed on the non-display area. The chip mount area includes a data output pad unit, a lighting test transistor unit and a plurality of lines connecting the data output pad unit and the lighting test transistor unit. The lighting test transistor unit is configured to transfer at least one lighting test signal to the plurality of pixels through the data output pad unit.

Resistances of a plurality of lines connecting between the data output pad unit and the lighting test transistor unit are the same.

The data output pad unit may comprise first, second and third data output pads configured in a plurality of rows, the lighting test transistor unit may comprise first, second and third lighting test transistors configured in a plurality of rows, and a length of a first line connecting the first data output pad and one end of the first lighting test transistor to each other, a length of a second line connecting the second data output pad and one end of the second lighting test transistor to each other, and a length of a third line connecting the third data output pad and one end of the third lighting test transistor to each other may be the same.

The first, second and third data output pads may have a quadrangle shape such as a parallelogram.

The chip mount area may comprise a data input pad unit connected to the lighting test transistor unit, and the data input pad unit may be connected to a plurality of ground lines.

Each of resistances of the plurality of ground lines may be 500 K$\Omega$ to 1 M$\Omega$.

Gate electrodes of the first, second and third lighting test transistors may be respectively connected to first, second and third lighting test control signal lines, and other ends of the first, second and third lighting test transistors may be respectively connected to first, second and third test signal lines.

A first test signal applied through the first test signal line may be a red test signal, a second test signal applied through the second test signal line may be a green test signal, and a third test signal applied through the third test signal line may be a blue test signal.

The chip mount area may comprise a dummy output pad unit disposed on at least one side of the data output pad unit, and a dummy transistor unit connected to the dummy output pad unit.

The dummy output pad unit may comprise first, second and third dummy output pads configured in a plurality of rows, the dummy transistor unit may comprise first, second and third dummy transistors configured in a plurality of rows, and a length of a fourth line connecting the first dummy output pad and one end of the first dummy transistor to each other, a length of a fifth line connecting the second dummy output pad and one end of the second dummy transistor to each other, and a length of a sixth line connecting the third dummy output pad and one end of the third dummy transistor to each other may be the same.

The first, second and third dummy output pads may have any one shape of a parallelogram and a triangle.

The length of the first, second and third lines may be longer than the length of the fourth to sixth lines.

The chip mount area may comprise a dummy input pad unit connected to the dummy transistor unit, and the dummy input pad unit may be connected to a plurality of ground lines.

Each of resistances of the plurality of ground lines may be 500 K$\Omega$ to 1 M$\Omega$.

Gate electrodes of the first, second and third dummy transistors and other ends of the first, second and third dummy transistors may be in a floating state.

The data output pad unit may comprise first, second and third data output pads configured in a plurality of rows, the lighting test transistor unit may comprise first, second and third lighting test transistors configured in a plurality of rows, some of a first line connecting the first data output pad and one end of the first lighting test transistor to each other, a second line connecting the second data output pad and one end of the second lighting test transistor to each other, and a third line connecting the third data output pad and one end of the third lighting test transistor to each other may comprise a bend portion, and lengths of the first, second and third lines may be the same.

The chip mount area may comprise a data input pad unit connected to the lighting test transistor unit, and the data input pad unit may b; connected to a plurality of ground lines.

The chip mount area may comprise a dummy output pad unit disposed on at least one side of the data output pad unit, and a dummy transistor unit connected to the dummy output pad unit.

The dummy output pad unit may comprise first, second and third dummy output pads configured in a plurality of rows, the dummy transistor unit may comprise first, second and third dummy transistors configured in a plurality of rows, and a length of a fourth line connecting the first dummy output pad and one end of the first dummy transistor to each other, a length of a fifth line connecting the second dummy output pad and one end of the second dummy transistor to each other, and a length of a sixth line connecting the third dummy output pad and one end of the third dummy transistor to each other may be the same.

The chip mount area may comprise a dummy input pad unit connected to the dummy transistor unit, and the dummy input pad unit may be connected to a plurality of ground lines.

Each of resistances of the plurality of ground lines may be 500 KΩ to 1 MΩ.

The display device according to an embodiment of the disclosure may protect a lighting test thin film transistor from static electricity through pad routing of a display panel.

The effect according to the disclosure is not limited by the contents exemplified above, and more various effects are comprised in the present specification.

BRIEF DESCRIPTION OF THE DRAWINGS

The above and other features of the disclosure will become more apparent by describing in further detail exemplary embodiments thereof with reference to the accompanying drawings, in which.

DETAILED DESCRIPTION OF EXEMPLARY EMBODIMENTS

Figure 1:
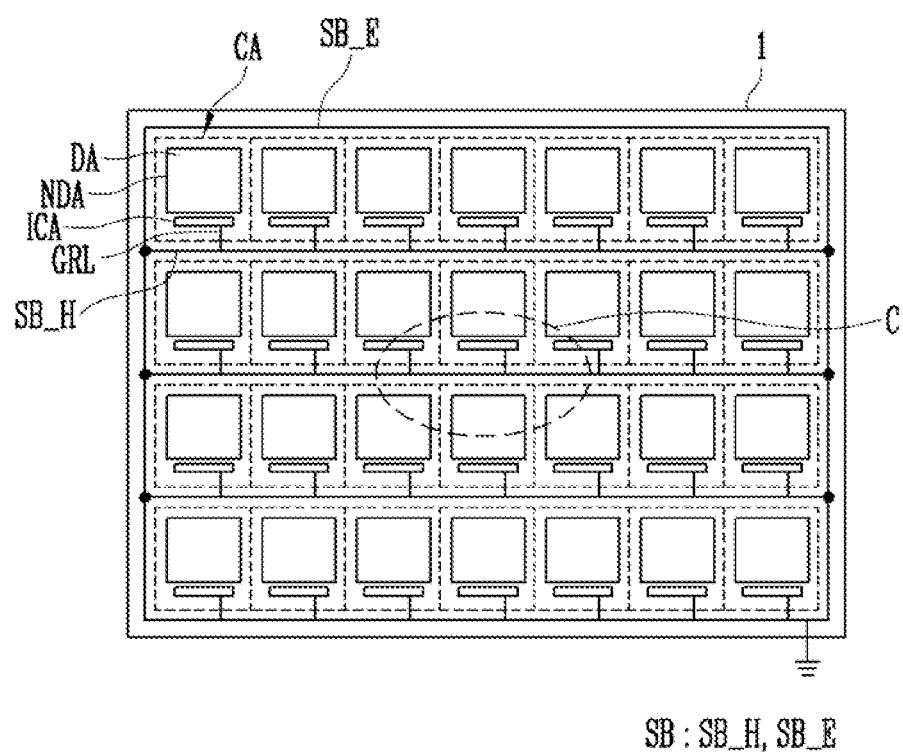
FIG. 1 is a diagram illustrating a mother substrate comprising a shorting bar according to an exemplary embodiment of the present inventive concepts.

The same reference numerals refer lo the same components. In addition, in the drawings, thicknesses, ratios, and dimensions of the components are exaggerated for effective description of technical contents. "And/or" comprises all of one or more combinations that may be defined by associated configurations.

Terms of "first", "second", and the like may be used to describe various components. However, the components are not be limited by the terms. The terms are used only for the purpose of distinguishing one component from another component. For example, without departing from the scope of the present inventive concepts, a first component may be referred to as a second component, and similarly, a second component may also be referred to as a first component. The singular expressions comprise plural expressions unless the context clearly indicates otherwise.

In addition, terms of "under", "below", "on", and "above" are used to describe an association of configurations shown in the drawings The terms are described based on a direction indicated in the drawings as relative concepts.

It should be understood that a term of "comprise", "have", or the like is used to specify that there is a feature, a number, a step, an operation, a component, a part, or a combination thereof described in the specification. However, these terms do not exclude a possibility of the presence or addition of one or more other features, numbers, steps, operations, components, parts, or combinations thereof in advance.

FIG. 1 is a diagram for describing a mother substrate comprising a shorting bar.

Referring to the exemplary embodiment or FIG. 1, the mother substrate 1 comprises a plurality of cell areas CA. The cell areas CA may respectively correspond to array substrates of a unit display panel completed in a subsequent process.

A size of each of the plurality of cell areas CA may be changed according to a size of a display device. In the exemplary embodiment of FIG. 1, 28 cell areas CA are formed in one mother substrate 1. However, exemplary embodiments of the present inventive concepts are not limited thereto and the numbers and the arrangement of the plurality of cell areas CA may vary in other exemplary embodiments.

According to an exemplary embodiment of the present inventive concepts, a shorting bar SB may be formed in the mother substrate 1. For example, the shorting bar SB may be formed of a plurality of horizontal portions SB_H formed for each horizontal row of the plurality of cell areas CA, and an edge portion SB_E connecting the plurality of horizontal portions SB_H and surrounding the entire edge of the plurality of cell areas CA.

Each of the plurality of cell areas CA comprises a non-display area NDA and a display area DA. The non-display area NDA may comprise a chip mount area ICA on which a driving integrated circuit is bonded, and the display area DA may comprise a panel load unit. The panel load unit may comprise electrical elements such as a plurality of gate lines, a plurality of data lines, and a plurality of thin film transistors formed in the display area DA.

The chip mount area ICA may be electrically connected to the shorting bar SB through a plurality of connection lines, such as a plurality of ground lines GRL. The chip mount area ICA may be a portion to which a driving integrated circuit (IC) is attached in a subsequent process. In an exemplary embodiment, a display device comprising the chip mount area ICA may be a display device of a chip on plastic (COP) or chip on glass (COG) type in which the driving IC is directly connected to an array substrate. However, exemplary embodiments of the present inventive concepts are not limited thereto.

Since the shorting bar SB is formed to be much larger than other lines, the shorting bar SB may serve as a reservoir for charge. Since a stage on which the mother substrate 1 is placed during a thin film transistor process is mostly grounded, the charge accumulated in the shorting bar SB may be discharged through the stage.

A deposition process of the mother substrate 1 may be performed in a vacuum slate through a deposition facility. A mask may be positioned on the mother substrate 1 for the deposition process. When the mother substrate 1 and the mask are in contact with each other, the charge accumulated in the mother substrate 1 through induction, friction, and peeling charging, or the like is discharged to a point that is in contact with the mask at the same time, and thus a previously formed thin film transistor may be damaged. The mother substrate 1 and the mask are generally in contact with each other at a center area C of the mother substrate 1 by their own gravity. Accordingly, the cell areas CA disposed in the center of the mother substrate 1 are required to be protected from static electricity.

Figure 2:
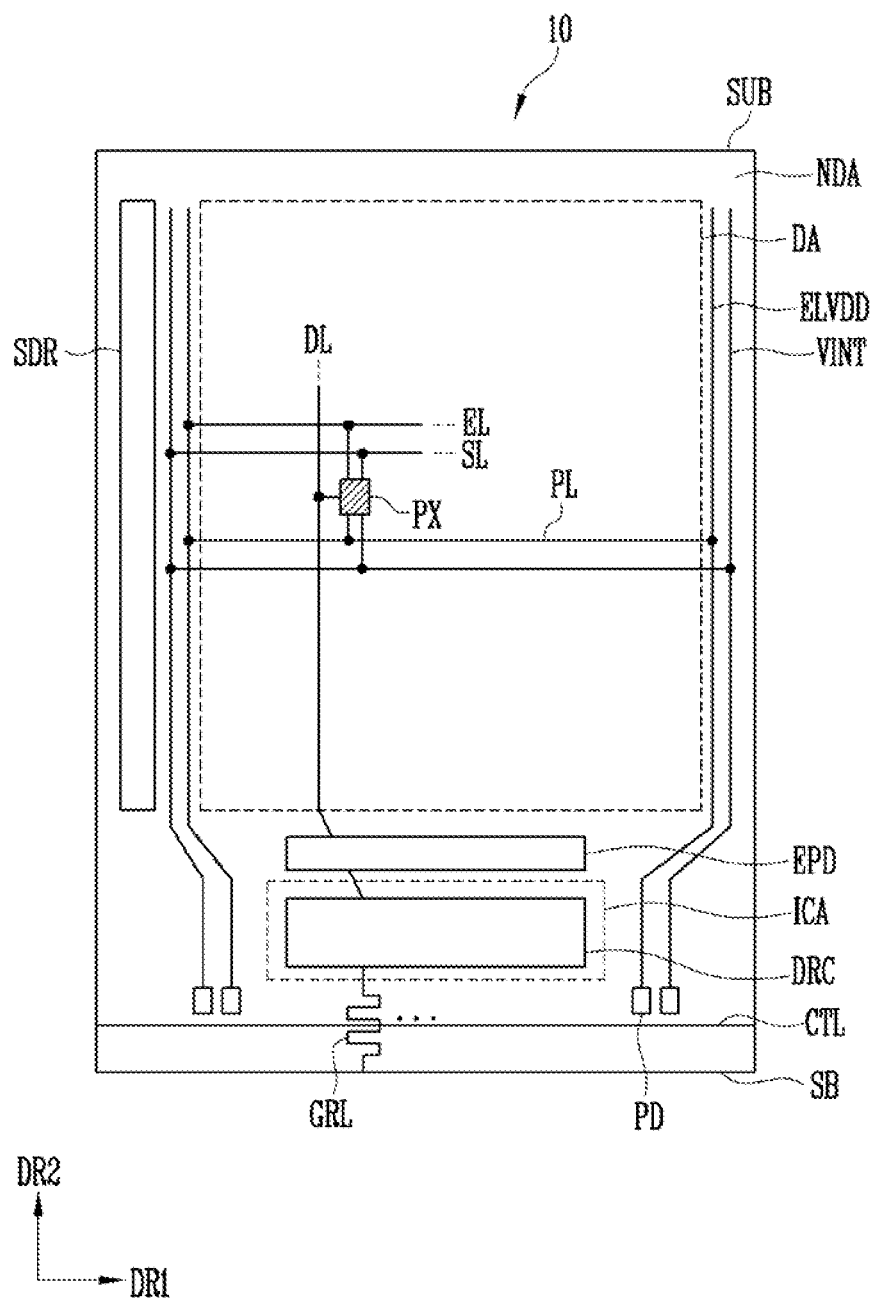
FIG. 2 is a plan view illustrating a display device according to an exemplary embodiment of the present inventive concepts.

FIG. 2 is a diagram for describing a display device according to an exemplary embodiment of the present inventive concepts.

Referring to the exemplary embodiment of FIG. 2, the display device 10 may comprise a display area DA and a non-display area NDA in a plan view. The display device 10 may comprise a plurality of pixels PX. An area in which the plurality of pixels PX are disposed is defined as the display area DA. In the exemplary embodiment shown in FIG. 2, the non-display area NDA may be defined along an edge of the display area DA. For example, the non-display area NDA may surround at least one side of the display area DA. In an exemplary embodiment, the plurality of pixels PX may be formed of a red pixel, a green pixel, and a blue pixel that are repeatedly disposed, and the red pixel, the green pixel, and the blue pixel may comprise one unit pixel.

The display device 10 may comprise scan lines SL, data lines DL, emission lines EL, an initialization voltage line VINT, a voltage line ELVDD, a pad unit PD, an anti-static diode unit EPD a driving integrated circuit DRC, and a chip mount area ICA.

The scan lines SL are respectively connected to corresponding pixels PX of the plurality of pixels PX, and the data lines DL are respectively connected to corresponding pixels PX of the plurality of pixels PX. Each of the emission lines EL may be arranged in parallel with a corresponding scan line among the scan lines SL. As shown in the exemplary embodiment of FIG. 2, the scan lines SL and the emission lines EL may extend in the first direction DR1. The initialization voltage line Vint may provide an initialization voltage to the plurality of pixels PX. The voltage line PL may be connected to the plurality of pixels PX and may provide a first voltage to the plurality of pixels PX. The voltage line PL may extend in the first direction DR1 and comprise a plurality of lines arranged in a second direction DR2 that is perpendicular to the first direction DR1.

A scan driving circuit SDR connected to the scan lines SL and the emission lines EL may be disposed on one side of the non-display area NDA. For example, as shown in the exemplary embodiment of FIG. 2, the scan driving circuit SDR may be disposed on a left side of the non-display area NDA. However, exemplary embodiments of the present inventive concepts are not limited thereto. Some of the scan lines SL, the data lines DL, the emission lines EL, the initialization voltage line Vint, and the voltage line ELVDD may be disposed on the same layer, and others may be disposed on different layers.

The anti-static diode unit EPD may be positioned on the non-display area NDA between the display area DA and the chip mount area ICA (e.g., in the second direction DR2).

The pad unit PD may be connected to ends of the initialization voltage line Vint and the voltage line ELVDD.

The chip mount area ICA may be disposed in the non-display area NDA of the base substrate SUB. A driving integrated circuit DRC for driving a plurality of scan lines SL and a plurality of data lines DL to display an image on the plurality of pixels PX is mounted on the chip mount area ICA.

The driving integrated circuit DRC may be mounted on the chip mount area ICA after a lighting test process for the plurality of pixels PX. The driving integrated circuit DRC supplies a gate signal to the plurality of scan lines SL based on power, a timing control signal, and a timing clock signal, and the like input from a flexible circuit board attached to the base substrate SUB. In addition, the driving integrated circuit DRC converts digital input data input from a flexible circuit board into an analog data signal, and supplies the converted data signal to the plurality of data lines DL. An input pad unit IPD and an output pad unit OPD on which the driving integrated circuit DRC is mounted may be formed in the chip mount area ICA as shown in the exemplary embodiment of FIG. 5. which will be described later.

The chip mount area ICA may be connected to the shorting bar SB through a ground line GRL. A portion of the plurality of ground lines GRL may be exposed to the outside along a cutting line CTL that cuts the mother substrate 1 into each cell area CA. The ground line GRL will be described later in detail with reference to the exemplary embodiments of FIGS. 6 and 7.

Figure 3:
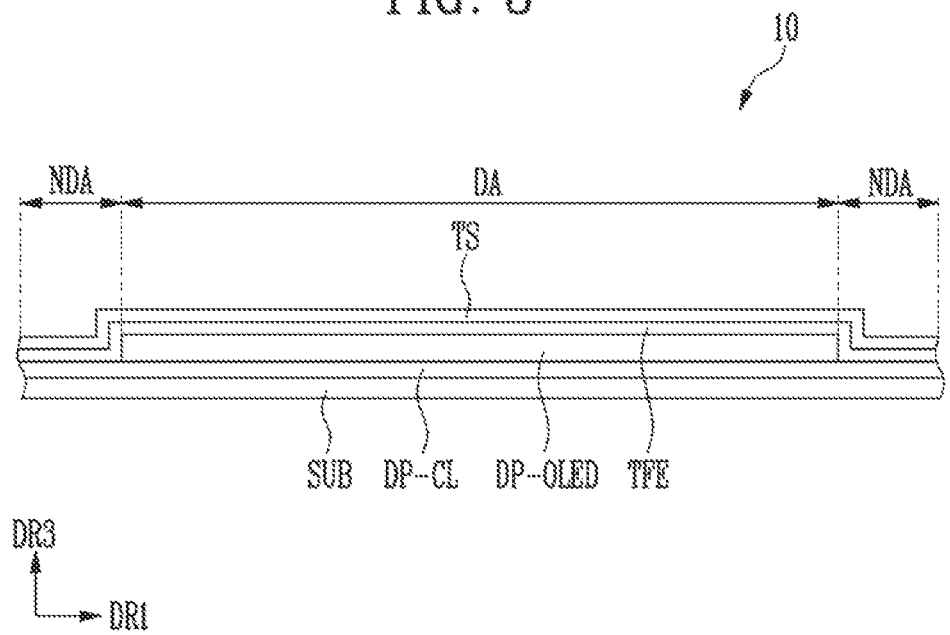
FIG. 3 is a cross-sectional view of the display device according to an exemplary embodiment of the present inventive concepts.

FIG. 3 is a cross-sectional view of the display device according to an exemplary embodiment of the present inventive concepts.

Referring to the exemplary embodiment of FIG. 3, the display device 10 may comprise a base substrate SUB and a circuit layer DP-CL disposed on the base substrate SUB in a third direction DR3 that is perpendicular to an upper surface of the substrate SUB and perpendicular to the first direction DR1 and the second direction DR2. A light emitting clement layer DP-OLED is disposed on the circuit layer DP-CL (e.g., in the third direction DR3). An encapsulation layer TFE surrounds the light emitting element layer DP-OLED. For example, as shown in the exemplary embodiment of FIG. 3, the encapsulation layer TFE may directly contact an upper surface and lateral side surfaces of the light emitting element layer DP-OLED.

In an exemplary embodiment, the base substrate SUB may comprise a plastic substrate, a glass substrate, a metal substrate, an organic/inorganic composite substrate, or the like. For example, the plastic substrate may comprise at least one material selected from acrylic-based resin, methacrylic-based resin, polyisoprene, vinyl-based resin, epoxy-based resin, urethane-based resin, cellulose-based resin, siloxane-based resin, polyimide-based resin, polyamide-based resin, and perylene-based resin. In an exemplary embodiment, the base substrate SUB may be a flexible substrate. However, exemplary embodiments of the present inventive concepts are not limited thereto and the base substrate SUB may be a rigid substrate in other exemplary embodiments.

The base substrate SUB may be divided into the display area DA and the non-display area NDA adjacent to the display area DA. For example, the non-display area NDA may be disposed at an edge of the display area DA. However, exemplary embodiments of the present inventive concepts are not limited thereto. For example, in an exemplary embodiment, the non-display area NDA may be defined on only one side of the display area DA.

The circuit layer DP-CL may be disposed on the base substrate SUB. The circuit layer DP-CL may be disposed on the display area DA and the non-display area NDA of the base substrate SUB. The circuit layer DP-CL may comprise at least one pixel insulating layer, a plurality of conductive layers, and a semiconductor layer. The plurality of conductive layers of the circuit layer DP-CL may configure signal lines or a driving circuit of the pixel.

The light emitting element layer DP-OLED may comprise organic light emitting diodes. The light emitting element layer DP-OLED may be disposed on the display area DA.

The encapsulation layer TFE may be disposed on the light emitting element layer DP-OLED. The encapsulation layer TFE may be disposed to surround the light emitting element layer DP-OLED. The encapsulation layer TFE may cover and seal the light emitting element layer DP-OLED. In an exemplary embodiment, the encapsulation layer TFE may comprise at least one inorganic layer and at least one organic layer. For example, the encapsulation layer TFE may comprise at least two inorganic layers and an organic layer disposed therebetween. The inorganic layer protects the light emitting element layer DP-OLED from moisture/oxygen, and the organic layer protects the light emitting element layer DP-OLED from foreign substance such as a dust particle. In an exemplary embodiment, the inorganic layer may comprise a silicon nitride layer, a silicon oxy nitride layer, a silicon oxide layer, and the like. The organic layer may comprise an acrylic-based organic material. However, exemplary embodiments of the present inventive concepts are not limited thereto. In an exemplary embodiment, the inorganic layer may be provided by a deposition method, and the organic layer may be provided using a coating process. However, exemplary embodiments of the present inventive concepts are not limited thereto.

A touch sensing unit TS is disposed on the encapsulation layer TFE. For example, as shown in the exemplary embodiment of FIG. 3, the touch sensing unit TS may be directly disposed on the encapsulation layer TFE (e.g., in the third direction DR3). However, exemplary embodiments of the present inventive concepts are not limited thereto, and in other exemplary embodiments, an inorganic layer may be disposed between the encapsulation layer TFE and the touch sensing unit TS. The inorganic layer may be a buffer layer. In an exemplary embodiment, the inorganic layer may be at least one material selected from a silicon nitride layer, a silicon oxy nitride layer, and a silicon oxide layer. However, this is merely an example, and exemplary embodiments of the present inventive concepts are not limited thereto. In addition, the buffer layer may be an organic layer. Although the buffer layer has been described as a separate configuration, the encapsulation layer TFE may be configured to include the buffer layer.

The touch sensing unit TS comprises touch sensors and touch signal lines. The touch sensors and the touch signal lines may have a single layer or multilayer structure.

In an exemplary embodiment, the touch sensors and the touch signal lines may comprise at least one compound selected from indium tin oxide (ITO), indium zinc oxide (IZO), zinc oxide (ZnO), indium tin zinc oxide (ITZO), PEDOT, a metal nanowire, and graphene. The touch sensors and the touch signal lines may comprise a metal layer, for example, molybdenum, silver, titanium, copper, aluminum, or an alloy thereof. The touch sensors and the touch signal lines may have the same layer structure or different layer structures. Details of the touch sensing unit TS will be described later.

Figure 4:
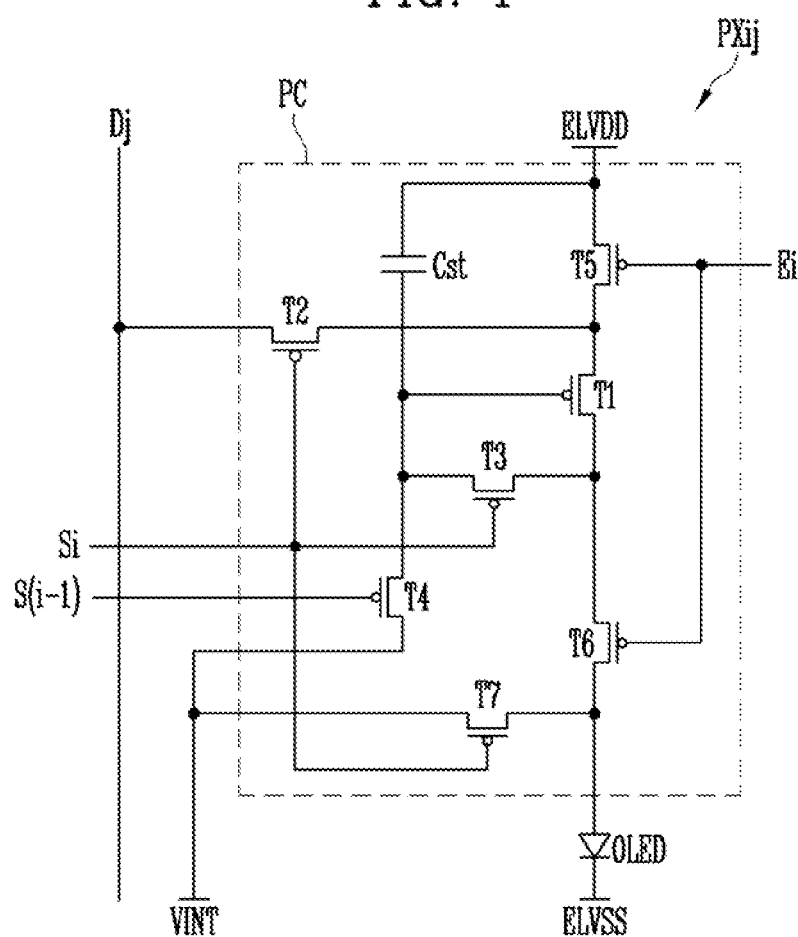
FIG. 4 is a circuit diagram of a pixel comprised in the display device according to an exemplary embodiment of the present inventive concepts.

FIG. 4 is a circuit diagram of a pixel comprised in the display device according to an exemplary embodiment of the present inventive concepts. FIG. 4 illustrates an i-th pixel PXij connected to a j-th data line Dj among the plurality of data lines DL (refer to FIG. 2). Each of i and j may be a positive integer.

Referring to the exemplary embodiment of FIG. 4, the pixel PXij may comprise first to seventh transistors T1, T2, T3, T4, T5, T6, and T7, a storage capacitor Cst, and an organic light emitting diode OLED.

Although the transistors according to an exemplary embodiment of the present inventive concepts are shown as P-type transistors, in other exemplary embodiments, the pixel circuit may be configured to perform the same function with N-type transistors.

A first electrode of the storage capacitor Cst may be connected to first power voltage line ELVDD, and a second electrode of the storage capacitor Cst may be connected to a gate electrode of the first transistor T1.

In the first transistor T1, a first electrode may be connected to a second electrode of the fifth transistor T5, a second electrode of the first transistor T1 may be connected to a first electrode of the sixth transistor T6, and the gate electrode of the first transistor T1 may be connected to a second electrode of the storage capacitor Cst. The first transistor T1 may be referred to as a driving transistor. The first transistor T1 determines a driving current amount flowing between the first power voltage line ELVDD and a second power voltage line ELVSS according to a potential difference between the gate electrode and a source electrode.

In the second transistor T2, a first electrode may be connected to the data line Dj, the second electrode of the second transistor T2 may be connected to the first electrode of the first transistor T1. A gate electrode of the second transistor T2 may be connected to a current scan line Si. The second transistor T2 may be referred to as a switching transistor, a scan transistor, a gate transistor, or the like. The second transistor T2 introduces a data voltage of the data line Dj into the pixel PXij when a scan signal of a turn-on level is applied to the current scan line Si.

In the third transistor T3, a first electrode is connected to a second electrode of the first transistor T1, a second electrode of the third transistor T3 is connected to the gate electrode of the first transistor T1, and a gate electrode of the third transistor T3 is connected to the current scan line Si. The third transistor T3 connects the first transistor T1 in a diode form when the scan signal of the turn-on level is applied to the current scan line Si.

In the fourth transistor T4, a first electrode is connected to the gate electrode of the first transistor T1, a second electrode of the fourth transistor T4 is connected to the initialization voltage line VINT, and a gate electrode of the fourth transistor T4 is connected to a previous scan line S(i−1). In another exemplary embodiment, the gate electrode of the fourth transistor T4 may be connected to another scan line. The fourth transistor T4 transfers an initialization voltage to the gate electrode of the first transistor T1 to initialize a charge amount of the gate electrode of the first transistor T1 when the scan signal of the turn-on level is applied to the previous scan line S(i−1).

In the fifth transistor T5, a first electrode is connected to the first power voltage line ELVDD, a second electrode of the fifth transistor T5 is connected to the first electrode of the first transistor T1, and a gate electrode of the fifth transistor T5 is connected to an emission line Ei. In the sixth transistor T6, the first electrode is connected to the second electrode of the first transistor T1, a second electrode of the sixth transistor T6 is connected to an anode electrode of the organic light emitting diode OLED, and a gate electrode of the sixth transistor T6 is connected to the emission line Ei. The fifth and sixth transistors T5 and T6 may be referred to as emission transistors. The fifth and sixth transistors T5 and T6 form a driving current path between the first power voltage line ELVDD and the second power voltage line ELVSS to emit the organic light emitting diode OLED when an emission signal of a turn-on level is applied.

In the seventh transistor T7, a first electrode is connected to the anode electrode of the organic light emitting diode OLED, a second electrode of the seventh transistor T7 is connected to the initialization voltage line VINT, and a gate electrode of the seventh transistor T7 is connected to the current scan line Si. In another exemplary embodiment, the gate electrode of the seventh transistor T7 may be connected to another scan line. For example, the gate electrode of seventh transistor T7 may be connected to the previous scan line S(i−1), a scan line previous to the scan line S(i−1), a next scan line ((i+1)-th scan line), or a scan line next to the next scan line ((i+1)-th scan line). The seventh transistor T7 transfers an initialization voltage to the anode electrode of the organic light emitting diode OLED to initialize the charge amount accumulated in the organic light emitting diode OLED when the scan signal of the turn-on level is applied to the current scan line Si.

In the organic light emitting diode OLED, the anode electrode may be connected to the second electrode of the sixth transistor T6, and a cathode electrode may be connected to the second power voltage line ELVSS.

Figure 5:
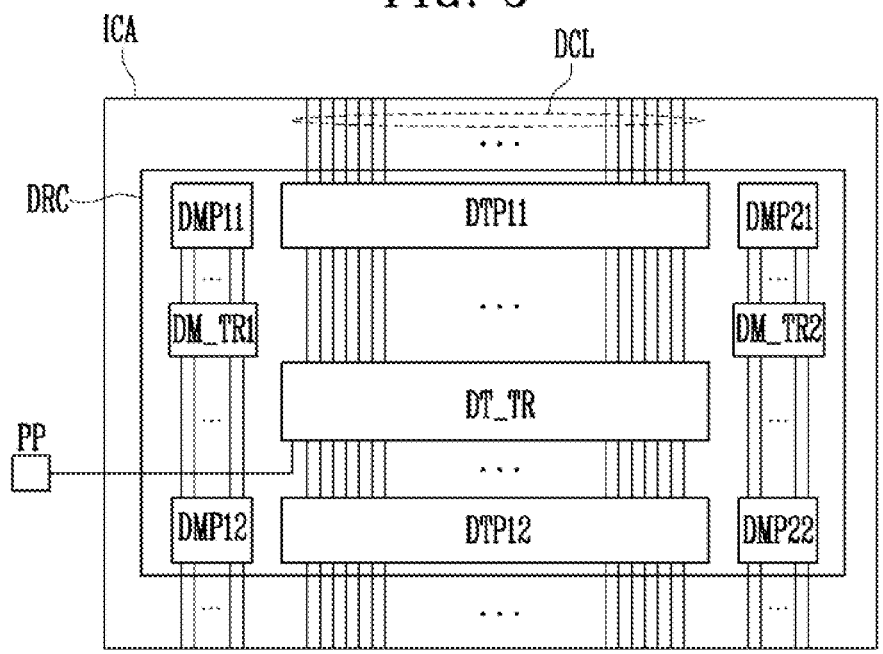
FIG. 5 is a block diagram of a chip mount area shown in FIG. 2 according to an exemplary embodiment of the present inventive concepts.

FIG. 5 is a block diagram of the chip mount area shown in the exemplary embodiment of FIG. 2.

Referring to the exemplary embodiment of FIG. 5, the chip mount area ICA may comprise an output pad unit OPD, an input pad unit IPD, first and second dummy transistor units DM_TR1 and DM_TR2, and a lighting test transistor unit DT_TR. A probe pad PP may be disposed outside the chip mount area ICA. The driving integrated circuit DRC may be mounted on the chip mount area ICA after the lighting test process. The driving integrated circuit DRC (refer to FIG. 2) may comprise a plurality of input bumps and a plurality of output bumps.

The input pad unit IPD may comprise a plurality of input pads electrically connected to the plurality of input bumps formed in the driving integrated circuit DRC. The input pad unit IPD may comprise a data input pad unit DTP12, a first dummy input pad unit DMP12, and a second dummy input pad unit DMP22. Each of the plurality of input pad units IPD may be electrically connected to a flexible circuit board.

The output pad unit OPD may be electrically connected to the plurality of output bumps formed in the driving integrated circuit DRC. The output pad unit OPD may comprise a data output pad unit DTP11, a first dummy output pad unit DMP11, and a second dummy output pad unit DMP21. Each of the plurality of output pad units OPD may be electrically connected to the plurality of data lines DL formed in the display area DA through data connection line DCL.

In the chip mount area ICA, a first dummy transistor unit DM_TR1, a second dummy transistor unit DM_TR2, and the lighting test transistor unit DT_TR may be disposed between the input pad unit IPD and the output pad unit OPD. The lighting test transistor unit DT_TR may be electrically connected to the output pad unit OPD to supply a test signal to the output pad unit OPD. The first and second dummy transistors DT_TR1 and DT_TR2 may be connected to the first and second dummy output pad units DMP11 and DMP21, respectively. However, the first and second dummy transistors DT_TR1 and DT_TR2 does not supply the test signal to the output pad unit OPD.

The probe pad PP may supply various test signals provided from a test jig to the lighting test transistor unit DT_TR through a test signal line during a lighting test process, and may supply various enable signals to the lighting test transistor unit DT_TR through an enable signal line.

In the display device 10, the output pad unit OPD formed in the chip mount area ICA may not be covered by an insulating layer and may be exposed to the outside during a manufacturing process. Therefore, a thin film transistor may be damaged due to static electricity. In the related art, when comparing a resistance of conductors connected to the display area DA and conductors connected to the lighting test transistor unit DT_TR through the anti-static diode unit EPD based on the data output pad unit DTP11, as the resistance of the conductors connected to the lighting test transistor unit DT_TR is relatively small, an electrostatic current flows toward the lighting test transistor unit DT_TR. Therefore, there has been cases where the lighting test transistor unit DT_TR is damaged. Hereinafter, routing methods for preventing damage of the lighting test transistor unit DT_TR will be described in detail with reference to the exemplary embodiments of FIGS. 6 to 10.

Figure 6:
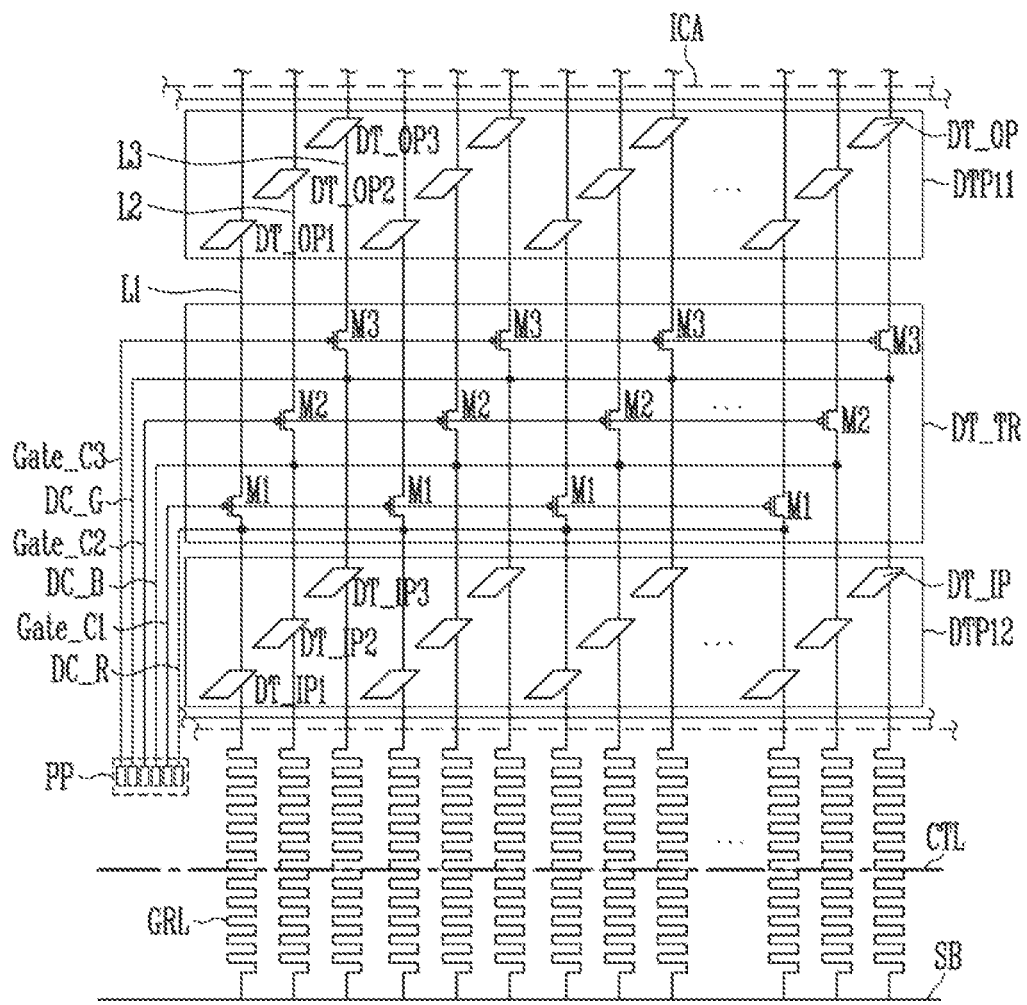
FIG. 6 is a diagram illustrating the routing of a lighting test pad and a lighting test thin film transistor according to an exemplary embodiment of the present inventive concepts.

FIG. 6 is a diagram for describing routing of a lighting test pad and the lighting test thin film transistor according to an exemplary embodiment of the present inventive concepts.

Referring to the exemplary embodiments of FIGS. 2, 5, and 6, the display area DA may comprise first pixels, second pixels, and third pixels that emit light of different colors. For example, the first, second and third pixels may have a structure arranged on a line in first, second and third column lines, respectively. Each pixel may comprise a pixel circuit PC as shown in the exemplary embodiment of FIG. 4.

In an exemplary embodiment, the first pixels may be red pixels emitting red light, the second pixels may be blue pixels emitting blue light, and the third pixels may be green pixels emitting green light.

However, exemplary embodiments of the present inventive concepts are not limited thereto. For example, in other exemplary embodiments, the display area DA may further comprise a different color pixel (e.g., a white pixel, etc.) for displaying a color other than red, green, and blue.

The lighting test transistor unit DT_TR may comprise a plurality of transistors. For example, as shown in the exemplary embodiment of FIG. 6, the lighting test transistor unit DT_TR may comprise first to third transistors M1 to M3. However, exemplary embodiments of the present inventive concepts are not limited thereto and the numbers of transistors may vary in other exemplary embodiments. A first end of the first to third transistors M1 to M3 may be connected to each of a plurality of data output pads DT_OP of the data output pad unit DTP11, and an opposite second end of the first to third transistors M1 to M3 may be connected to each of a plurality of data input pads DT_IP of the data input pad unit DTP12. Each of the data output pads DT_OP may be connected to the plurality of data lines DL formed in the display area DA by the data connection line DCL via the anti-static diode unit EPD. The lighting test transistor unit DT_TR transfers a lighting test signal to the pixels in the display area DA through the data output pad unit DTP11.

For example, as shown in the exemplary embodiment of FIG. 6, a red test signal DC_R, a blue test signal DC_B, and a green test signal DC_G may be supplied to the data lines DL through the lighting test transistor unit DT_TR, respectively. However, in exemplary embodiments which include different colored pixels, the test signals that are supplied may correspond to the different colors of the pixels. As shown in the exemplary embodiment of FIG. 6, gates of the first lighting test transistors M1 may be commonly connected to a line supplying a first lighting test control signal Gate_C1, gates of the second lighting test transistors M2 may be commonly connected to a line supplying a second lighting test control signal Gate_C2, and gates of the third lighting test transistors M3 may be commonly connected to a line supplying a third lighting test control signal Gate_C3.

The first, second and third lighting test control signals Gate_C1, Gate_C2, and Gate_C3 may be a direct current form for maintaining a turn-on state of the first, second and third lighting test transistors M1 to M3. The first, second and third lighting test control signals Gate_C1, Gate_C2, and Gate_C3 may be supplied to the gates of the first, second and third lighting test transistors M1 to M3 while a lighting test is performed. Therefore, the first, second and third lighting test transistors M1 to M3 may supply the red test signal DC_R, the blue test signal DC_B, and the green test signal DC_G supplied from the lighting test signal line to the plurality of data lines DL, respectively, while maintaining the turn-on state.

The scan driving circuit SDR may sequentially generate scan signals and supply the scan signals to the display area DA. Therefore, the pixels receiving the scan signal and the lighting test signal may emit light to display an image, and thus the lighting test and the like may be performed.

While all of the first to third lighting test transistors M1 to M3 are shown as transistors of a PMOS type, exemplary embodiments of the present inventive concepts are not limited thereto. For example, in another exemplary embodiment, all of the first to third lighting test transistors M1 to M3 may be transistors of an NMOS type or transistors of different conduction types.

According to an exemplary embodiment of the present inventive concepts, the plurality of respective data output pads DT_OP may be spaced apart from each other by a predetermined interval and may be formed in parallel in a plurality of rows. For example, the plurality of data output pads DT_OP may comprise first, second and third data output pads DT_OP1, DT_OP2, and DT_OP3. However, exemplary embodiments of the present inventive concepts are not limited thereto and in other exemplary embodiments the number of the plurality of data output pads DT_OP may vary. As shown in the exemplary embodiment of FIG. 6, the first, second and third data output pads DT_OP1, DT_OP2, and DT_OP3 may have a quadrangle shape, such as a parallelogram shape. However, exemplary embodiments of the present inventive concepts are not limited thereto. The first, second and third data output pads DT_OP1, DT_OP2, and DT_OP3 may be arranged in three rows.

The respective first, second and third lighting test transistors M1 to M3 may be spaced apart from each other by a predetermined interval and may be formed in parallel in a plurality of rows. For example, as shown in the exemplary embodiment of FIG. 6, the first, second and third lighting test transistors M1 to M3 may be arranged in three rows. The respective first, second and third lighting test transistors M1 to M3 may be spaced apart from the first, second and third data output pads DT_OP1, DT_OP2, and DT_OP3 by the same interval.

For example, all of a resistance of a first line L1 corresponding to a line from the first data output pad DT_OP1 to the first lighting test transistors M1, which is a path through which static electricity flows, a resistance of a second line L2 corresponding to a line from the second data output pad DT_OP2 to the second lighting test transistors M2, and a resistance of a third line L3 cot responding to a line from the third data output pad DT_OP3 to the third lighting test transistors M3 may be substantially the same.

In general, an electrostatic current is more likely to flow toward the data output pad DT_OP connected to a line having a smaller resistance among the plurality of output pads DT_OP. According to an exemplary embodiment of the present inventive concepts, when the resistances of each of the first, second and third lines L1, L2, and L3, which correspond to the lines between the first, second and third lighting test transistors M1 to M3 and the first, second and third data output pads DT_OP1, DT_OP2, and DT_OP3, respectively, are balanced, the electrostatic current may not flow to any one of the plurality of output pads DT_OP, and the electrostatic current may be more likely to flow toward an area other than the plurality of output pads DT_OP.

The plurality of respective data input pads DT_IP may be spaced apart from each other by a predetermined interval and may be formed in parallel in a plurality of rows. For example, the plurality of data input pads DT_IP may comprise first, second and third data input pads DT_IP1, DT_IP2, and DT_IP3. However, exemplary embodiments of the present inventive concepts are not limited thereto and in other exemplary embodiments the number of the plurality of data input pads DT_IP may vary. As shown in the exemplary embodiment of FIG. 6, the first, second and third data input pads DT_IP1, DT_IP2, and DT_IP3 may have a parallelogram shape. However, exemplary embodiments of the present inventive concepts are not limited thereto. The first, second and third data input pads DT_IP1, DT_IP2, and DT_IP3 may be arranged in three rows.

First ends of the first, second and third data input pads DT_IP1, DT_IP2, and DT_IP3 may be connected to the first, second and third lighting test transistors M1 to M3, respectively, and the opposite second ends of the first, second and third data input pads DT_IP1, DT_IP2, and DT_IP3 may be connected to a first end of the plurality of ground lines GRL. An opposite second end of the plurality of ground lines GRL may be connected to the shorting bar SB shown in the exemplary embodiment of FIGS. 1 and 6. The plurality of ground lines GRL may be formed to have a bend so that the length thereof is maximized in a relatively narrow space. Therefore, the plurality of ground lines GRL may have a high resistance value. For example, in an exemplary embodiment, the resistance of the ground line GRL may be in a range of about 500 KΩ to about 1 MΩ.

Therefore, even though an electrostatic current flows to any one of the plurality of output pads DT_OP during the manufacturing process of the display device 10, since the ground line GRL having a high resistance value is positioned on a path through which the electrostatic current is emitted, a sudden discharge of the electrostatic current may be prevented. Therefore, damage to the first, second and third lighting test transistors M1 to M3 positioned on the emission path of the electrostatic current may be prevented.

A portion of the plurality of ground lines GRL spaced apart from the first ends of the plurality of ground lines GRL may be exposed to the outside along the cutting line CTL for cutting the mother substrate 1 into each cell area CA. Therefore, the ground lines GRL may serve to prevent static electricity from being flowed from the outside of the display device 10 after the driving integrated circuit DRC is mounted on the chip mount area ICA.

Figure 7:
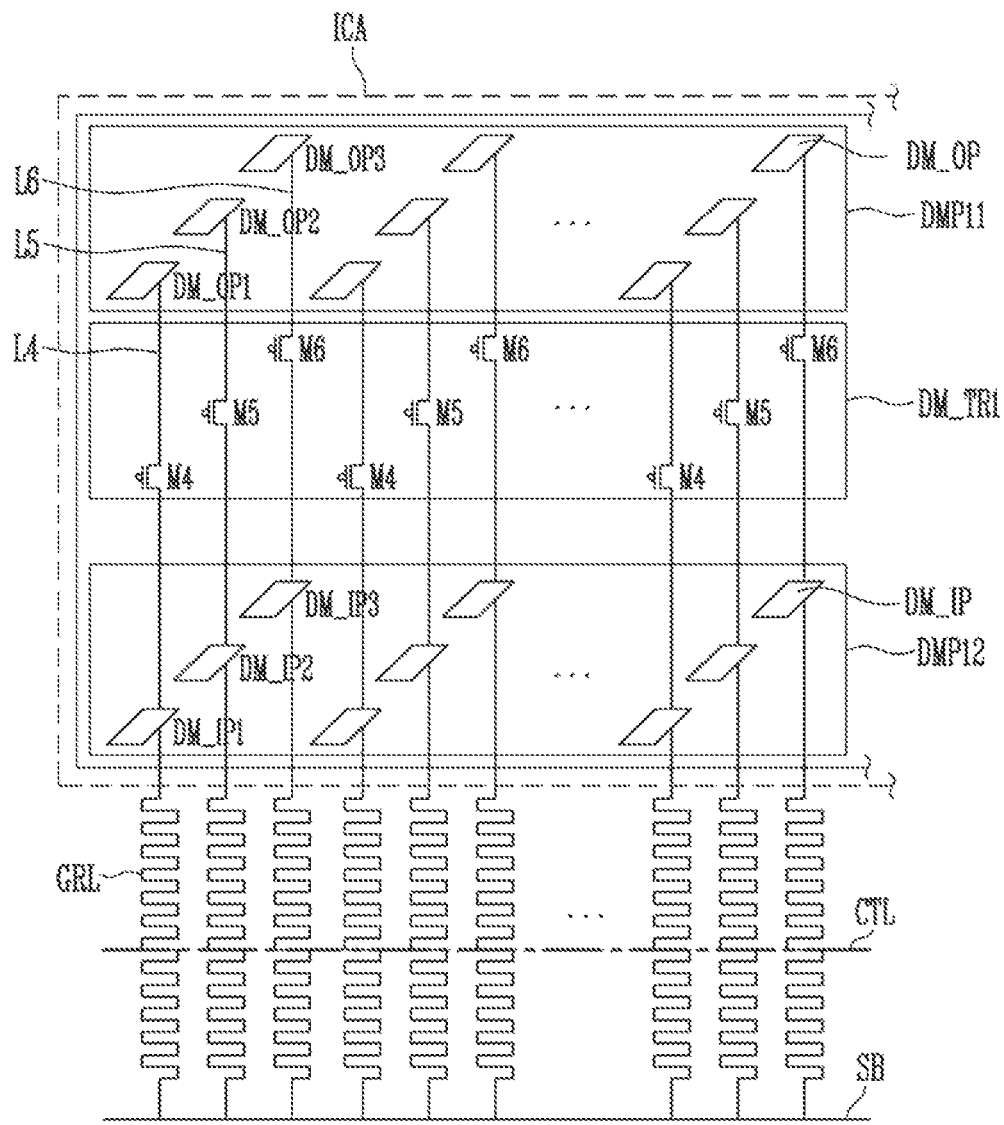
FIG. 7 is a diagram illustrating the routing of a dummy pad and a dummy thin film transistor according to an exemplary embodiment of the present inventive concepts.

FIG. 7 is a diagram for describing routing of a dummy pad and a dummy thin film transistor according to an exemplary embodiment of the present inventive concepts.

Referring to the exemplary embodiments of FIGS. 2, 5, and 6, the first dummy output pad unit DMP11 may be disposed on a left side of the data output pad unit DTP11, and the second dummy output pad unit DMP21 may be disposed on a right side of the data output pad unit DTP11. Each of the plurality of first and second dummy output pads DMP11 and DMP12 is not electrically connected to the display area DA. While the positions in which the first and second dummy output pad units DMP11 and DMP21 are disposed are different from each other, the first and second dummy output pad units DMP11 and DMP21 are configured substantially the same. Therefore, a description of the dummy output pad units will be given based on the first dummy output pad unit DMP11.

According to an exemplary embodiment of the present inventive concepts, a plurality of respective dummy output pads DM_OP may be spaced apart from each other by a predetermined interval and may be formed in parallel in a plurality of rows. For example, as shown in the exemplary embodiment of FIG. 7, the plurality of dummy output pads DM_OP may comprise first, second and third dummy output pads DM_OP1, DM_OP2, and DM_OP3. However, exemplary embodiments of the present inventive concepts are not limited thereto and in other exemplary embodiments the number of the plurality of dummy output pads DM_OP may vary. As shown in the exemplary embodiment of FIG. 7, the first, second and third dummy output pads DM_OP1, DM_OP2, and DM_OP3 may have a parallelogram shape. However, exemplary embodiments of the present inventive concepts are not limited thereto. As shown in the exemplary embodiment of FIG. 7, the first, second and third dummy output pads DM_OP1, DM_OP2, and DM_OP3 may be disposed in three rows.

Similarly, respective first, second and third dummy transistors M4 to M6 in the first dummy transistor unit DM_TR1 may be spaced apart from each other by a predetermined interval and may be formed in parallel in a plurality of rows. For example, as shown in the exemplary embodiment of FIG. 7, the first, second and third dummy transistors M4 to M6 may be disposed in three rows. The respective first, second and third dummy transistors M4 to M6 may be spaced apart from the first, second and third dummy output pads DM_OP1, DM_OP2, and DM_OP3 by the same distance.

However, in contrast with the first, second and third lighting test transistors M1 to M3 shown in the exemplary embodiment of FIG. 6, the first, second and third dummy transistors M4 to M6 may not supply the first, second and third lighting test control signals Gate_C1, Gate_C2, and Gate_C3, the red test signal DC_R, the blue test signal DC_B, and the green test signal DC_G of a direct current form to the plurality of data lines DL, respectively. For example, the first, second and third dummy transistors M4 to M6 may be in a floating state. For example, the gate electrodes and the second ends of the first to third M4 to M6 dummy transistors may be in a floating state.

According to an exemplary embodiment of the present inventive concepts, a distance between the first dummy output pad unit DMP11 and the first dummy transistor unit DM_TR1 may be shorter than a distance between the data output pad unit DTP11 and the lighting test transistor unit DT_TR. For example, a length of a fourth line L4 corresponding to a line from the first dummy output pads DM_OP1 to the first dummy transistor M4 shown in the exemplary embodiment of FIG. 7 may be shorter than the length of the first line L1 corresponding to the line from the first data output pads DT_OP1 to the first lighting test transistor M1 shown in the exemplary embodiment of FIG. 6. A length of a fifth line L5 corresponding to a line from the second dummy output pads DM_OP2 to the second dummy transistor M5 shown in the exemplary embodiment of FIG. 7 may be shorter than the length of the second line L2 corresponding to the line from the second data output pads DT_OP2 to the second lighting test transistor M2 shown in the exemplary embodiment of FIG. 6. Likewise, a length of a sixth line L6 corresponding to a line from third dummy output pads DM_OP3 to the third dummy transistor M6 shown in the exemplary embodiment of FIG. 7 may be shorter than the length of the third line L3 corresponding to the line from the third data output pads DT_OP3 to the third lighting test transistor M3 shown in the exemplary embodiment of FIG. 6.

The electrostatic current is more likely to flow toward a side connected to a line having a smaller resistance among the first dummy output pad unit DMP11, the second dummy output pad unit DMP21, and the data output pad unit DTP11. Therefore, when a distance between the first dummy output pad unit DMP11 and the first dummy transistor unit DM_TR1 is shorter than a distance between the data output pad unit DTP11 and the lighting test transistor unit DT_TR, the electrostatic current is more likely to flow to the first dummy transistor unit DM_TR1 rather than the lighting test transistor unit DT_TR.

A plurality of respective dummy input pads DM_IP may be spaced apart from each other by a predetermined interval and may be formed in parallel in a plurality of rows. For example, the plurality of dummy input pads DM_IP may comprise first, second and third dummy input pads DM_IP1, DM_IP2, and DM_IP3. However, exemplary embodiments of the present inventive concepts are not limited thereto and in other exemplary embodiments the number of the plurality of dummy input pads DM_IP may vary. As shown in the exemplary embodiment of FIG. 7, the first, second and third dummy input pads DM_IP1, DM_IP2, and DM_IP3 may have a parallelogram shape. However, exemplary embodiments of the present inventive concepts are not limited thereto. As shown in the exemplary embodiment of FIG. 7, the first, second and third dummy input pads DM_IP1, DM_IP2, and DM_IP3 may be disposed in three rows.

First ends of the first, second and third dummy input pads DM_IP1, DM_IP2, and DM_IP3 may be connected to the first, second and third dummy transistors M4 to M6, respectively, and the opposite second ends may be connected to the plurality of ground lines GRL, respectively. The second ends of the plurality of ground lines GRL may be connected to the shorting bar SB shown in the exemplary embodiments of FIGS. 1, 6 and 7. The plurality of ground lines GRL may be formed to have a bend so that the length thereof is maximized in a narrow space. Therefore, the plurality of ground lines GRL may have a high resistance value. For example, a resistance of the ground line GRL may be in a range of about 500 KΩ to about 1 MΩ.

A portion of the plurality of ground lines GRL spaced apart from the first ends of the plurality of ground lines GRL may be exposed to the outside along the cutting line CTL for cutting the mother substrate 1 into each cell area CA. Therefore, the ground lines GRL may serve to prevent static electricity from being flowed from the outside of the display device 10 after the driving integrated circuit DRC is mounted on the chip mount area ICA.

Hereinafter, other exemplary embodiments of the present inventive concepts will be described. In the following exemplary embodiment, the same configuration as the already described exemplary embodiments will be omitted or simplified, and differences will be mainly described.

Figure 8:
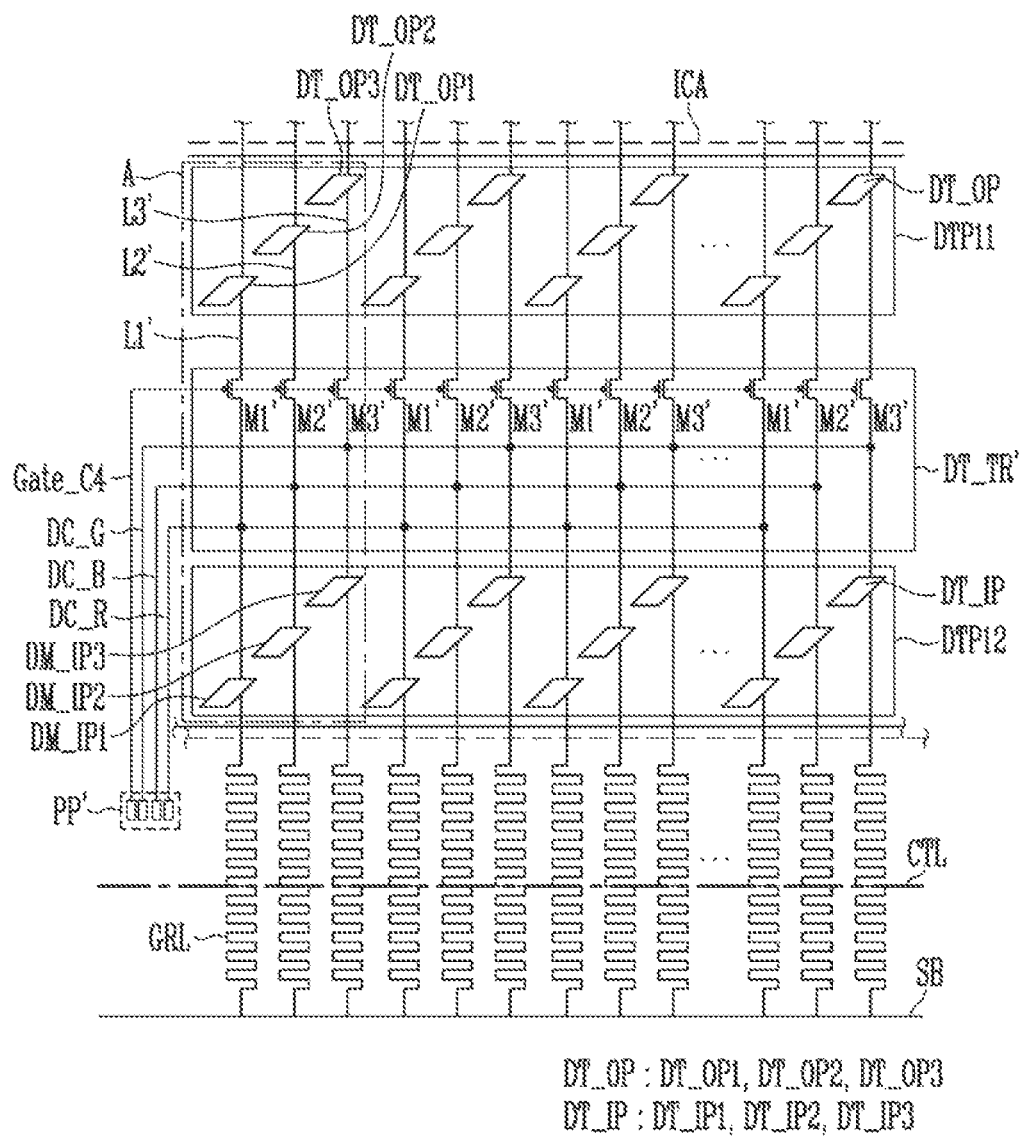
FIG. 8 is a diagram illustrating the routing of the lighting test pad and the lighting test thin film transistor according to an exemplary embodiment of the present inventive concepts.
Figure 9:
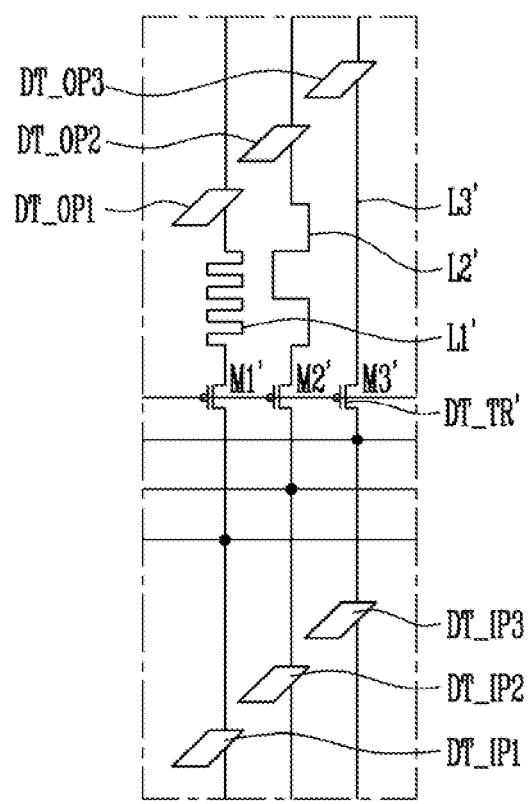
FIG. 9 is an enlarged view of region A of FIG. 8 according to an exemplary embodiment of the present inventive concepts.

FIG. 8 is a diagram for describing routing of the lighting test pad and the lighting test thin film transistor according to another exemplary embodiment of the present inventive concepts. FIG. 9 is an enlarged view of a region A of FIG. 8 according to an exemplary embodiment of the present inventive concepts.

Referring to the exemplary embodiments of FIGS. 2, 5, 8, and 9, the exemplary embodiment shown in FIG. 8 is different from the exemplary embodiment shown in FIG. 6 in that the shortest distance from the first data output pads DT_OP1 to a first lighting test transistor M1', the shortest distance from the second data output pads DT_OP2 to a second lighting test transistor M2', and the shortest distance from the third data output pads DT_OP3 to a third lighting test transistor M3' are different from each other.

A lighting test transistor unit DT_TR' may comprise a plurality of transistors. For example, as shown in the exemplary embodiment of FIG. 8, the plurality of transistors of the lighting test transistor unit DT_TR' may comprise first to third transistors M1' to M3'. However, exemplary embodiments of the present inventive concepts are not limited thereto and in other exemplary embodiments the number of the plurality of transistors of the lighting test transistor unit DT_TR' may vary. The first to third transistors M1' to M3' are disposed in a same row in contrast to the first to third transistors M1 to M3 shown in the exemplary embodiment of FIG. 6. First ends of the first to third transistors M1' to M3' may be respectively connected to the plurality of data output pads DT_OP, and opposite second ends of the first to third transistors M1' to M3' may be respectively connected to the plurality of data input pads DT_IP. Each of the data output pads DT_OP may be connected to the plurality of data lines DL formed in the display area DA (e.g., by the data connection line DCL) via the anti-static diode unit EPD.

The red test signal DC_R, the blue test signal DC_B, and the green test signal DC_G may be supplied to the data lines DL through the first, second and third lighting test transistors M1', M2', and M3', respectively. Gates of the first lighting test transistors M1', gates of the second lighting test transistors M2', and gates of the third lighting test transistors M3' may be commonly connected to a line supplying a fourth lighting test control signal Gate_C4.

The fourth lighting test control signals Gate_C4 of a direct current form for maintaining a turn-on state of the first, second and third lighting test transistors M1' to M3' may be supplied to the gates of the first, second and third lighting test transistors M1' to M3' while a lighting test is performed. Therefore, the first, second and third lighting test transistors M1' to M3' may supply the red test signal DC_R, the blue test signal DC_B, and the green test signal DC_G supplied from the lighting test signal line to the plurality of data lines DL, respectively, while maintaining the turn-on state.

The scan driving circuit SDR may sequentially generate scan signals and supply the scan signals to the display area DA. Therefore, the pixels receiving the scan signal and the lighting test signal may emit light to display an image, and thus the lighting test and the like may be performed.

While all of the first to third lighting test transistors M1' to M3' are shown as transistors of a PMOS type, exemplary embodiments of the present inventive concepts are not limited thereto. For example, in other exemplary embodiments, all of the first to third lighting test transistors M1' to M3' may be transistors of an NMOS type or transistors of different conduction types.

According to an exemplary embodiment of the present inventive concepts, the plurality of respective data output pads DT_OP may be spaced apart from each other by a predetermined interval and may be formed in parallel in a plurality of rows. For example, the plurality of data output pads DT_OP may comprise the first, second and third data output pads DT_OP1, DT_OP2, and DT_OP3. However, exemplary embodiments of the present inventive concepts are not limited thereto and in other exemplary embodiments the number of the plurality of data output pads DT_OP may vary. In an exemplary embodiment, the first, second and third data output pads DT_OP1, DT_OP2, and DT_OP3 may have a parallelogram shape. However, exemplary embodiments of the present inventive concepts are not limited thereto. As shown in the exemplary embodiment of FIG. 8, the first, second and third data output pads DT_OP1, DT_OP2, and DT_OP3 may be arranged in three rows.

The respective first, second and third lighting test transistors M1' to M3' may be spaced apart from each other by a predetermined interval and may be formed in parallel in a single row. However, exemplary embodiments of the present inventive concepts are not limited thereto. The shortest distance from the first data output pads DT_OP1 to the first lighting test transistor M1', the shortest distance from the second data output pads DT_OP2 to the second lighting test transistor M2', and the shortest distance front the third data output pads DT_OP3 to the third lighting test transistor M3' may be different from each other. For example, as shown in the exemplary embodiment of FIG. 8, the shortest distance between the third data output pads DT_OP3 to the third lighting test transistor M3' may be larger than the shortest distance between the first data output pads DT_OP1 to the first lighting test transistor M1' and the shortest distance between the second data output pads DT_OP2 to the second lighting test transistor M2'. The shortest distance between the second data output pads DT_OP2 to the second lighting test transistor M2' may be larger than the shortest distance between the first data output pads DT_OP1 to the first lighting test transistor M1'. However, exemplary embodiments of the present inventive concepts are not limited thereto.

However, as shown in the exemplary embodiment of FIG. 9, a length of a first line L1' corresponding to a length from the first data output pads DT_OP1 to the first lighting test transistor M1', a length of a second line L2' corresponding to a length from the second data output pads DT_OP2 to the second lighting test transistor M2', and a length of a third line L3' corresponding to a length from the third data output pads DT_OP3 to the third lighting test transistor M3' may be formed to be substantially the same by adjusting a period of a bend. For example, as shown in the exemplary embodiment of FIG. 9, the period of the bend between the first data output pads DT_OP1 to the first lighting test transistor M1' may be larger than the period of the bend between the second data output pads DT_OP2 to the second lighting test transistor M2'. The period of the bend between the second data output pads DT_OP2 to the second lighting test transistor M2' may be larger than the period of the bend between the third data output pads DT_OP3 to the third lighting test transistor M3'.

For example, all of a resistance of the length of the first line L1' corresponding to the length from the first data output pads DT_OP1 to the first lighting test transistor M1', a resistance of the second line L2' corresponding to the length from the second data output pads DT_OP2 to the second lighting test transistor M2', and a resistance of the length of the third line L3' corresponding to the length from the third data output pads DT_OP3 to the third lighting test transistor M3 may be substantially the same.

Therefore, the routing of the lighting test pad and the lighting test thin film transistor of the display device shown in the exemplary embodiments of FIGS. 8-9 will have the same or a similar effect as the exemplary embodiment shown in FIG. 6.

Figure 10:
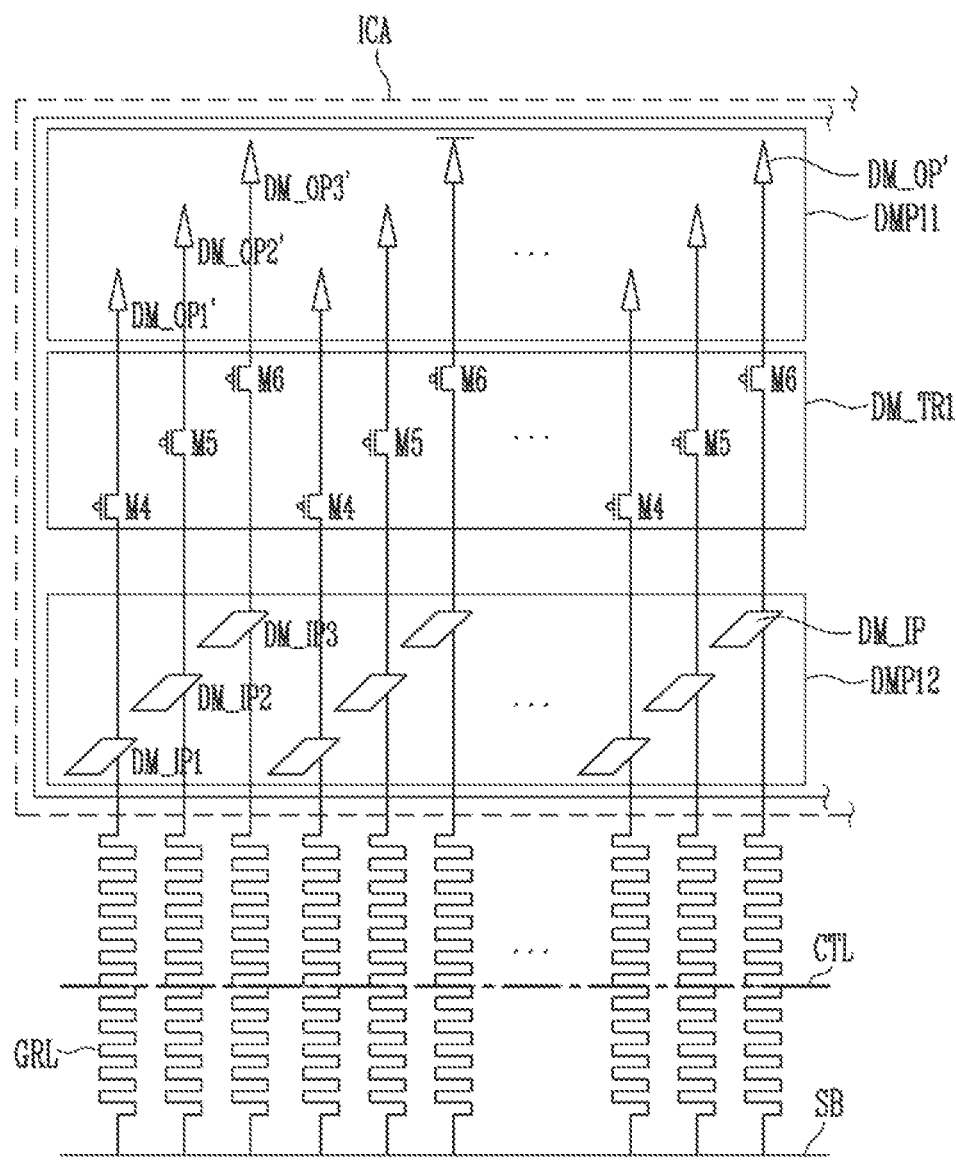
FIG. 10 is a diagram illustrating the routing of the dummy pad and the dummy thin film transistor according to an exemplary embodiment of the present inventive concepts.

FIG. 10 is a diagram for describing the routing of the dummy pad and the dummy thin film transistor according to another exemplary embodiment of the present inventive concepts.

Referring to the exemplary embodiments of FIGS. 2, 5, 7, and 10, the present exemplary embodiment is different from the exemplary embodiment shown in FIG. 7 in that first, second and third dummy output pads DM_OP1', DM_OP2', and DM_OP3' have a triangular shape of which an end is sharp.

Specifically, the plurality of respective dummy output pads DM_OP may be spaced apart from each other by a predetermined interval and may be formed in parallel in a plurality of rows. For example, the plurality of dummy output pads DM_OP may comprise the first, second and third dummy output pads DM_OP1', DM_OP2', and DM_OP3'. However, exemplary embodiments of the present inventive concepts are not limited thereto and in other exemplary embodiments the number of the plurality of dummy output pads DM_OP may vary. At least some of the first, second and third dummy output pads DM_OP1', DM_OP2', and DM_OP3' may have a triangular shape of which an end is sharp. As shown in the exemplary embodiment of FIG. 10, the first, second and third dummy output pads DM_OP1', DM_OP2', and DM_OP3' may be disposed in three rows.

In general, a charge may be distributed relatively large on a conductor surface of which a radius of curvature is small (e.g., a sharp portion). When static electricity is generated, a current may easily flow through a place where the charges are collected. Therefore, when the first, second and third dummy output pads DM_OP1', DM_OP2', and DM_OP3' have the triangular shape having a sharp end, the electrostatic current, which is generated in the manufacturing process of the display device 10 may be more likely to flow to the first to third dummy output pads DM_OP1', DM_OP2', and DM_OP3' in comparison with the plurality of data output pads DT_OP having a parallelogram shape.

The scope of the present inventive concepts is not limited to the details described in the detailed description of the exemplary embodiments. All changes, modifications and equivalent concepts are comprised in the scope of the present inventive concepts.

What is claimed is:

1. A display device comprising:
a substrate comprising a display area and a non-display area;
a plurality of pixels disposed in the display area; and
a chip mount area disposed on the non-display area, the chip mount area including a data output pad unit, a lighting test transistor unit and a plurality of lines connecting the data output pad unit and the lighting test transistor unit, the lighting test transistor unit is configured to transfer at least one lighting test signal to the plurality of pixels through the data output pad unit,
wherein resistances of each of the plurality of lines are the same.

2. The display device according to claim 1, wherein:
the data output pad unit comprises first, second and third data output pads arranged in a plurality of rows;
the lighting test transistor unit comprises first, second and third lighting test transistors arranged in a plurality of rows, and
a length of a first line connecting the first data output pad to a first end of the first lighting test transistor, a length of a second line connecting the second data output pad to a first end of the second lighting rest transistor, and a length of a third line connecting the third data output pad to a first end of the third lighting test transistor are the same.

3. The display device according to claim 2, wherein the first, second and third data output pads have a quadrangle shape.

4. The display device according to claim 2, wherein:
the chip mount area comprises a data input pad unit connected to the lighting test transistor unit; and
the data input pad unit is connected to a plurality of ground lines.

5. The display device according to claim 4, wherein each of the plurality of ground lines has a resistance in a range of about 500 KΩ to about 1 MΩ.

6. The display device according to claim 4, wherein:
gate electrodes of the first, second and third lighting test transistors are respectively connected to first, second and third lighting test control signal lines; and second ends of the first, second and third lighting test transistors art respectively connected to first, second and third test signal lines.

7. The display device according to claim 6, wherein a first test signal applied through the first test signal line is a red test signal, a second test signal applied through the second test signal line is a blue test signal, and a third test signal applied through the third test signal line is a green test signal.

8. The display device according to claim 2, wherein the chip mount area comprises:
a dummy output pad unit disposed on at least one lateral side of the data output pad unit; and
a dummy transistor unit connected to the dummy output pad unit.

9. The display device according to claim 8, wherein:
the dummy output pad unit comprise first, second and third dummy output pads arranged in a plurality of rows;
the dummy transistor unit comprises first, second and third dummy transistors arranged in a plurality of rows; and
a length of a fourth line connecting the first dummy output pad to a first end of the first dummy transistor, a length of a fifth line connecting the second dummy output pad to a first end of the second dummy transistor, and a length of a sixth line connecting the third dummy output pad to a first end of the third dummy transistor are the same.

10. The display device according to claim 9, wherein the first, second and third dummy output pads have a shape of a parallelogram or a triangle.

11. The display device according to claim 9, wherein the length of the first, second and third lines is longer than the length of the fourth to sixth lines.

12. The display device according to claim 9, wherein:
the chip mount area comprises a dummy input pad unit connected to the dummy transistor unit; and
the dummy input pad unit is connected to a plurality of ground lines.

13. The display device according to claim 12, wherein each of the plurality of ground lines has a resistance in a range of about 500 KΩ to about 1 MΩ.

14. The display device according to claim 9, wherein gate electrodes of the first, second and third dummy transistors and second ends of the first, second and third dummy transistors are in a floating slate.

15. The display device according to claim 1, wherein;
the data output pad unit comprises first, second, and third data output pads arranged in a plurality of rows;
the lighting test transistor unit comprises first, second and third lighting test transistors arranged in a plurality of rows,
at least one of a first line connecting the first data output pad to a first end of the first lighting test transistor, a second line connecting the second data output pad to a first end of the second lighting test transistor, and a third line connecting the third data output pad to a first end of the third lighting test transistor comprise a bend portion;
lengths of the first, second and third lines are the same; and
at least one of a shortest distance between the first data output pad to the first end of the first lighting test transistor, a shortest distance between the second data output pad to the first end of the second lighting test transistor, and a shortest distance between the third data output pad to the first end of the third lighting test transistor ate different from each other.

16. The display device according to claim 15, wherein;
the chip mount area comprises a data input pad unit connected to the lighting test transistor unit, and
the data input pad unit is connected to a plurality of ground lines.

17. The display device according to claim 15, wherein the chip mount area comprises:
a dummy output pad unit disposed on at least one lateral side of the data output pad unit; and
a dummy transistor unit connected to the dummy output pad unit.

18. The display device according to claim 17, wherein:
the dummy output pad unit comprises first, second and third dummy output pads arranged in a plurality of rows;
the dummy transistor unit comprises first, second and third dummy transistors arranged in a plurality of rows; and
a length of a fourth line connecting the first dummy output pad to a first end of the first dummy transistor, a length of a fifth line connecting the second dummy output pad to a first end of the second dummy transistor, and a length of a sixth line connecting the third dummy output pad to a first end of the third dummy transistor are the same.

19. The display device according to claim 18, wherein:
the chip mount area comprises a dummy input pad unit connected to the dummy transistor unit; and
the dummy input pad unit is connected la a plurality of ground lines.

20. The display device according to cairn 19, wherein each of the plurality of ground lines has a resistance in a range of about 500 KΩ to about 1 MΩ.

* * * * *